United States Patent
Zhang et al.

(10) Patent No.: US 6,563,868 B1
(45) Date of Patent: May 13, 2003

(54) METHOD AND APPARATUS FOR ADAPTIVE EQUALIZATION IN THE PRESENCE OF LARGE MULTIPATH ECHOES

(75) Inventors: Qin Zhang, Bensalem, PA (US); Shlomo Ovadia, Yardley, PA (US)

(73) Assignee: General Instruments Corporation, Horsham, PA (US)

( * ) Notice: Subject to any disclaimer, the term of this patent is extended or adjusted under 35 U.S.C. 154(b) by 0 days.

(21) Appl. No.: 09/182,576

(22) Filed: Oct. 29, 1998

Related U.S. Application Data

(60) Provisional application No. 60/093,311, filed on Jul. 17, 1998.

(51) Int. Cl.$^7$ .............................................. H03H 21/00
(52) U.S. Cl. ................................. 375/232; 379/406.08
(58) Field of Search ................................ 375/232, 233, 375/235; 379/406.08, 406.01, 406.11, 406.12, 406.09

(56) References Cited

U.S. PATENT DOCUMENTS

| | | | | |
|---|---|---|---|---|
| 4,225,937 A | * | 9/1980 | Perreault et al. ............. 364/726 |
| 4,823,382 A | * | 4/1989 | Matinez ....................... 379/411 |
| 5,243,624 A | | 9/1993 | Paik et al. ..................... 375/14 |
| 5,392,315 A | * | 2/1995 | Laud ........................... 375/14 |
| 5,416,799 A | * | 5/1995 | Currivan et al. ............. 375/232 |
| 5,526,426 A | * | 6/1996 | McLaughlin ................ 379/411 |
| 5,548,541 A | * | 8/1996 | Bierman et al. ........ 364/724.16 |
| 5,590,154 A | * | 12/1996 | Forni et al. .................. 375/229 |
| 5,627,896 A | * | 5/1997 | Southward et al. ........... 381/71 |
| 5,721,782 A | * | 2/1998 | Piket et al. .................... 381/66 |
| 5,805,481 A | * | 9/1998 | Raghunath ............. 364/724.19 |
| 5,907,497 A | * | 5/1999 | Raghunath ................ 364/724.2 |
| 5,914,983 A | * | 6/1999 | Bowser et al. ............... 375/232 |
| 5,920,840 A | * | 7/1999 | Satyamurti et al. ......... 704/267 |
| 6,044,068 A | * | 3/2000 | El Malki ..................... 370/286 |
| 6,058,408 A | * | 5/2000 | Fisher et al. ................. 708/322 |
| 6,078,614 A | * | 6/2000 | Brown et al. ................ 375/232 |
| 6,240,133 B1 | * | 5/2001 | Sommer et al. ............. 375/232 |
| 6,256,384 B1 | * | 7/2001 | Trump ........................ 379/411 |
| 6,266,409 B1 | * | 7/2001 | Laberteaux et al. ........ 379/410 |

OTHER PUBLICATIONS

Chae et al., "Hardware Architectures of Adaptive Equalizers for HDTV Receiver", IEEE Transaction on Signal Processing, vol. 46, No. 2, Feb. 1998, pp. 391–404.*

Chae et al., "Efficient VLSI Architectures of Adaptive Equalizers for QAM/VSB transmission", IEEE 1997 International Conference on Acoustics, Speech, and Signal Processing, ICASSP–97, pp. 4117–4120.*

Qureshi, Shahid U. H., "Adaptive Equalization," *Proceedings of the IEEE*, vol. 73, No. 9, Sep. 1985, pp. 1349–1387.

* cited by examiner

*Primary Examiner*—Chi Pham
*Assistant Examiner*—Dung X. Nguyen
(74) *Attorney, Agent, or Firm*—Barry R. Lipsitz; Douglas M. McAlliste

(57) ABSTRACT

The performance of a multiphase and/or multiple amplitude receiver, such as a 64/256 quadrature amplitude modulation (QAM) receiver, is improved in the presence of single and multiple echoes. A moving window adaptive decision feedback equalizer (DFE) is provided according to the adaptive equation $C_n(k+1) = C_n(k) - \Delta \cdot W(k) \cdot E_n(k) \cdot X_n(k)$, where $\Delta$ (delta) is the step size, $C_n(k)$ is the tap value of tap n for the k symbol, $E_n(k)$ is the error output at the symbol k, $X_n(k)$ is the received signal for pre-cursor taps (FFE) and past decision output for post-cursor taps (DFE), and $W(k)$ is the sliding window function at symbol k. In the adaptation process, some coefficients are fixed while other taps are being adapted. In particular, the adaptation is focused on a group of taps which correspond to received echoes. By only adjusting these taps, no interference or noise is introduced to the decision making device in the digital receiver and therefore, the effect of noise and echoes on the adaptation control is substantially reduced.

23 Claims, 3 Drawing Sheets

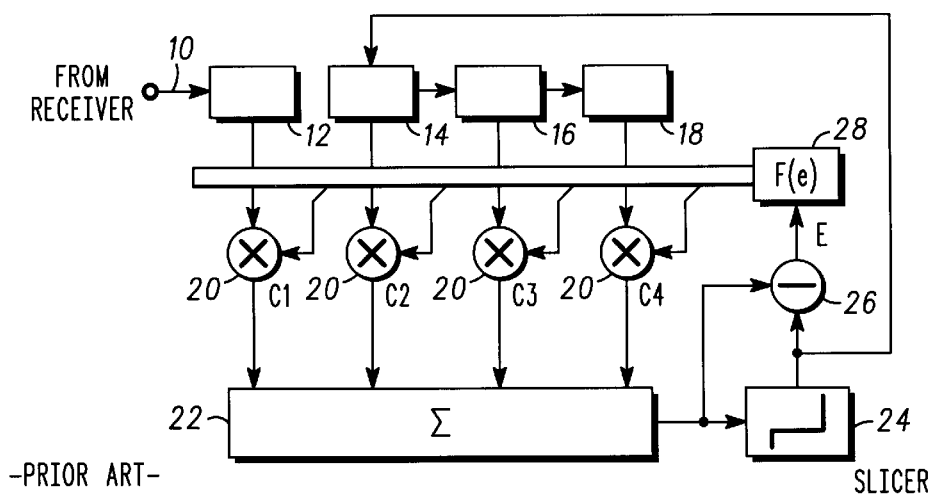
FIG. 1 -PRIOR ART-
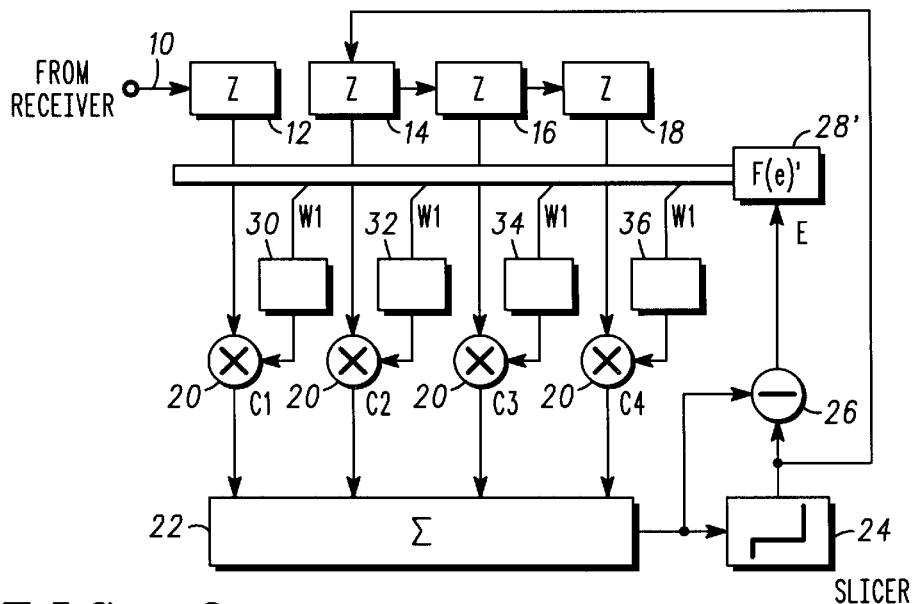
FIG. 2
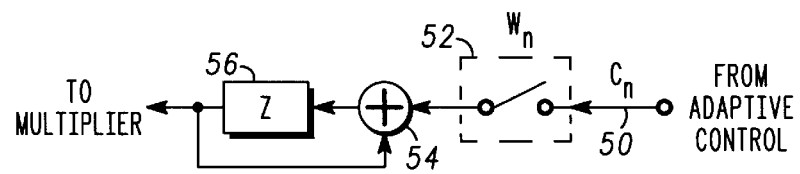
FIG. 3

METHOD AND APPARATUS FOR ADAPTIVE EQUALIZATION IN THE PRESENCE OF LARGE MULTIPATH ECHOES

This application claims the benefit of U.S. provisional application No. 60/093,311 filed Jul. 17, 1998.

BACKGROUND OF THE INVENTION

The present invention relates to digital communications, and more particularly to a robust digital adaptive equalizer for use, e.g., in high-speed digital communications and digital television broadcasting, such as high definition television (HDTV).

In high-speed digital communication and digital television broadcasting (cable or wireless), digital adaptive equalizers are used to compensate for linear channel distortions. See, for example, Paik et al. U.S. Pat. No. 5,243,624 issued on Sep. 7, 1993 for "Method and Apparatus for Updating Coefficients in a Complex Adaptive Equalizer", incorporated herein by reference.

Linear channel distortions generate Inter-Symbol Interference (ISI). With ISI, a received symbol contains delayed or advanced adjacent symbols with modified amplitude and shifted phase. The decision-making device in a digital receiver (slicer) produces incorrect data output with severe ISI. The output from a modulator/transmitter contains a known amount of ISI when a square-root raised cosine filter is used. However, in an ideal channel, the receiver Nyquist filter removes this known amount of ISI. The slicer will reproduce the same output data as the input data at the modulator.

Multiple reflections and diffraction from man-made obstacles such as large buildings, or from terrain such as mountains or trees, create multi-path distortion of the transmitted signal. In open wireless channels, multi-path introduces ISI into the received signal. In cable-TV transmission, micro-reflections due to impedance mismatch from various passive or active elements such as taps, amplifiers, and coaxial cables also create ISI. In a modern digital receiver, ISI is removed by an adaptive equalizer. A review by Shahid U. H. Qureshi, "Adaptive Equalization", *Proceedings of IEEE* 73, 1349–1387 (1985) describes some of the commonly used adaptive equalizers. The design of update algorithms to speed-up the rate of convergence of adaptive equalizers has been a topic of intense study for more than two decades. The rate of convergence for conventional Least-Mean-Square (LMS) stochastic equalizers is very slow when noise and large ISI are present. The LMS stochastic equalizer may not be able to converge in the presence of severe noise and multipath echoes.

The present invention provides a new robust adaptive equalizer for a multiphase and/or multi-amplitude receiver such as a quadrature amplitude modulation (QAM) or vestigal side-band (VSB) receiver based on a modified computationally efficient LMS algorithm. This equalizer effectively removes the noise and ISI effect from the tap adaptation with fast and accurate adaptation of equalizer tap values. In fact, simulation results show that the LMS error magnitude converges more than 100 times faster than the conventional LMS algorithms. Simulation results further show that the inventive algorithm works equally well for signed, signed-signed and shift-and-signed stochastic LMS algorithms, which are commonly used in today's high-speed digital receivers.

SUMMARY OF THE INVENTION

In accordance with the invention, a method is provided for updating coefficients (e.g., complex coefficients) in an adaptive equalizer. The equalizer has at least one equalizer filter stage with taps that receive the coefficients during successive filter clock cycles. A set of said taps that correspond to received echoes is identified. Only the taps in said set (i.e., those that correspond to received echoes) are adjusted according to a current error output from said equalizer. In this manner, the equalizer coefficients that do not correspond to received echoes remain fixed while the other equalizer coefficients that do correspond to received echoes are being adjusted.

The identifying step can use a trial-and-error method to identify the taps corresponding to the received echoes. Alternatively, the identifying step can use a sweeping method to identify the taps corresponding to the received echoes. In still a further embodiment, the identifying step can use an off-line processing method to identify the taps corresponding to received echoes. In an illustrated embodiment, the coefficients are updated using a moving window algorithm to enable different taps to be adjusted at different times.

An adaptive equalizer is provided which has at least one equalizer filter stage with taps that receive coefficients, such as complex coefficients, to be updated during successive filter clock cycles. Means are provided for selectively adjusting different ones of said taps in response to received echoes. More particularly, only taps corresponding to received echoes are adjusted, whereby the equalizer coefficients that do not correspond to received echoes remain fixed while the other equalizer coefficients that do correspond to received echoes are being adjusted.

In a more specific embodiment, an adaptive equalizer for a digital communications receiver is provided having at least one equalizer filter stage with taps that receive coefficients (e.g., complex coefficients) to be updated during successive filter clock cycles. A processor is adapted to run an algorithm to locate taps that correspond to echoes received by said digital communications receiver. The taps are selectively responsive to the processor, such that only those taps which correspond to received echoes are adjusted to update the coefficients associated therewith.

The algorithm run by the processor can comprise either a trial-and-error routine, a sweeping routine, or an off-line processing routine to identify the taps corresponding to received echoes. In an illustrated embodiment, the coefficients are updated using a moving window algorithm to enable different taps to be adjusted at different times.

The taps may be adjusted, for example, using a binary switch. Alternatively, the taps may be adjusted using an attenuator or any other suitable means.

The communications receiver may be, for example, a quadrature amplitude modulation (QAM), quadrature phase shift keyed (QPSK), or vestigial sideband (VSB) receiver.

BRIEF DESCRIPTION OF THE DRAWINGS

FIG. 1 is a block diagram illustrating a conventional LMS stochastic adaptive equalizer;

FIG. 2 is a block diagram illustrating a windowed stochastic LMS adaptive equalizer in accordance with the invention;

FIG. 3 is a block diagram illustrating an example of an adaptive control structure that can be used in the equalizer of FIG. 2;

DETAILED DESCRIPTION OF THE INVENTION

Figure 4:
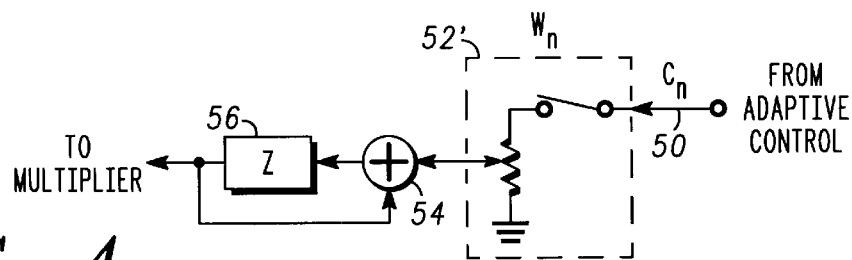
FIG. 4 is a block diagram illustrating an alternate embodiment of an adaptive control structure, wherein continuous attenuation is provided.

In prior art adaptive equalizers, tap values are adjusted according to error output from a slicer. For a decision feedback equalizer (DFE), for example, new tap coefficients for k+1 symbols are given by:

$$C_n(k+1)=C_n(k)-\Delta \cdot E_n(k) X_n(k); \quad \text{Eq.(1)}$$

where Δ (delta) is the step size, $C_n(k)$ is the tap value of tap n for the k symbol, $E_n(k)$ is the error output at the symbol k, $X_n(k)$ is the received signal for pre-cursor taps (FFE) and past decision output for post-cursor taps (DFE). This equation applies to all the taps at the same time. A conventional adaptive equalizer structure is shown in FIG. 1.

In the equalizer of FIG. 1, data from a received signal that is to be equalized is input to a first finite impulse response (FIR) delay stage 12 via terminal 10. Successive delay stages 14, 16 and 18 are also provided, which receive as input a feedback signal from a slicer 24, wherein the feedback signal is dependent on the data input at terminal 10. Coefficient data is input to each of a plurality of multipliers 20. The multipliers obtain the product of the coefficients with the input data from delay stage 12 and the feedback data as successively delayed by delay stages 14, 16 and 18. The products are summed together in an adder 22 for output to slicer 24 and a subtracter 26. The result of the subtraction is provided to the function F(e) referred to by reference numeral 28. The function F(e) is described by Equation (1).

The aforementioned U.S. Pat. No. 5,243,624 to Paik et al. describes an algorithm for a fast convergence adaptive equalizer, which adjusts all tap values at the same time and for every received symbol. This method produces a relatively fast convergence compared with other existing methods, which adjust only one tap at a time. However, this fast adaptation method is more susceptible to noise and large multipath echoes, in which no equalization is achieved. In the adaptive equalizer of the present invention, a moving window is introduced into the above equation. The adaptive equation becomes:

$$C_n(k+1)=C_n(k)-\Delta \cdot W(k) \cdot E_n(k) \cdot X_n(k); \quad \text{Eq.(2)}$$

where W(k) is the sliding window function at symbol k.

A new adaptive equalizer structure in accordance with the present invention is shown in FIG. 2. This equalizer is similar to that of FIG. 1, wherein like elements are similarly numbered, with the addition of moving window functions W1, W2, W3 and W4 represented by reference numerals 30, 32, 34, and 36, respectively. Moreover, the function F(e)' referred to by reference numeral 28' reflects the moving window, as represented by Equation 2.

The simplest form of the moving window is a binary switch, as illustrated by switch 52 in FIG. 3. When the switch is on, the corresponding tap value is adjusted according to the adaptive equation set forth above. If the switch is off, the corresponding tap value is fixed at the previous value. This adaptive control structure is shown in FIG. 3, wherein the tap value Cn is input via terminal 50 to the switch 52. The output of the switch is coupled to an adder 54, which receives feedback from the output of delay stage 56 as illustrated. In the adaptation process, some coefficients are fixed while other taps are being adapted. The insertion of the moving window in accordance with the present invention makes the equalizer more robust in the presence of noise and large echoes.

An alternative embodiment is illustrated in FIG. 4. In this embodiment, continuous attenuation of the tap value Cn is provided by an attenuator 52'. The attenuator can comprise any type of well known attenuating device, such as a variable impedance that may be controlled by appropriate digital logic or an analog circuit.

In the prior art adaptive method, every tap is adjusted according to the current error output, which is a noisy one. In such a method, taps without echoes are wrongfully adjusted by the error output. These wrongfully adjusted taps will introduce interference to the slicer and errors to the adaptive control. The channel noise and echoes determine the magnitude of the output error. Thus, this kind of equalizer requires a long time to converge. Very often, the old adjustment method leads to equalization failure in the presence of noise and large echoes.

In the adaptive equalizer of the present invention, the adaptation is focused on a group of taps, which correspond to the received echoes. By only adjusting these taps, no interference or noise is introduced to the slicer and adaptation control. Thus, the effect of noise and echoes on the adaptation control is substantially reduced over prior art implementations.

One critical issue is to identify the critical taps. There are several methods to identify the critical taps, such as:

1. Trial-and-error method;
2. Sweeping Method;
3. Off-line processing method.

In the trial-and-error method, no elaborate controller is required. First a blend equalization process is applied to the equalizer, as provided in the aforementioned U.S. Pat. No. 5,243,624 to Paik et al. After a period of time, when the equalizer has still not converged, the equalizer taps corresponding to large echoes will, on average, have larger values than other taps. A sliding window can be applied to the equalizer, to zoom the adaptation on these taps.

In the sweeping method, a sliding window with a selected pattern (for example, a Hamming window, square window, etc.) can be applied to the equalizer. This window is implemented to slide across the equalizer. If the equalizer converges, the window will gradually be expanded to include all taps in order to cancel the effect of multiple dynamic echoes.

In the off-line processing method a digital signal processor (DSP), micro-computer, micro-controller, or the like can be used to carry out signal spectrum analysis using, for example, Fast Fourier Transform (FFT) or Discrete Fourier Transform (DFT) techniques to identify critical taps.

Alternatively, fast converging adaptive equalization methods can be used to identify critical taps. Once critical taps are identified, the system controller optimizes the equalizer structure. Thus fast convergence and efficient tap usage can be achieved.

Figure 5:
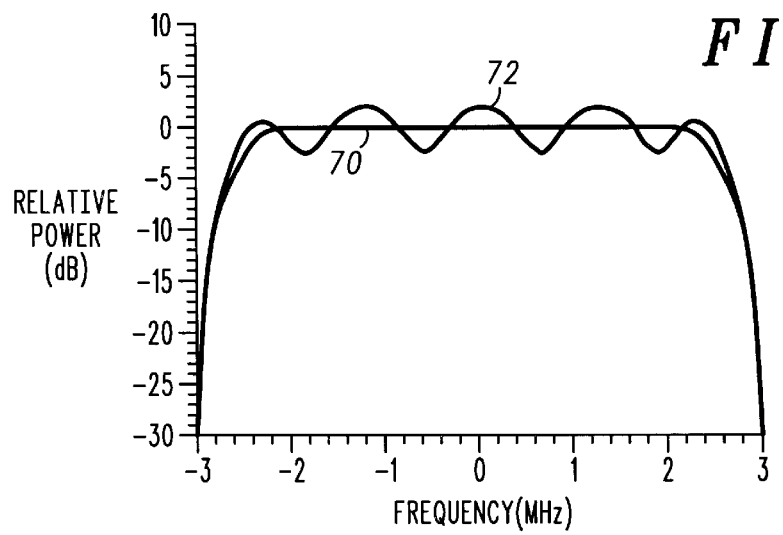
FIG. 5 is a graph providing an example of a simulated 64-QAM frequency spectrum with and without the presence of a single lagging echo with magnitude of −12 dBc relative to the main signal and 0.8-μs time-delay.

In an example embodiment of the off-line processing method, a dedicated DSP microprocessor or a general purpose microprocessor is used off-line to analyze the dominant echo pattern of the transmission channel based on the received RF frequency spectrum. In the presence of multipath echoes, constructive and destructive interference of the reflected signals with the direct or main signal causes ripples in an otherwise flat RF spectrum. FIG. 5, for example, shows a simulated frequency spectrum of a 64-QAM signal in the presence of a −12-dBc echo with 0.8-μs time-delay.

The following equation is an example of how to calculate the echo magnitude relative to the main propagating signal, where Δ is the peak-to-valley magnitude of the ripple in the spectrum:

$$EC(dBc) = 20 \cdot \log\left[\frac{10^{\Delta/20} - 1}{10^{\Delta/20} + 1}\right] \qquad \text{Eq. (3)}$$

It is assumed that only a single echo is present. FIG. 5 illustrates a simulated 64-QAM frequency spectrum 72 in the presence of −12 dBc lagging echo with 0.8-μs time-delay, and a spectrum 70 without such an echo.

If there are two echoes that are well separated in time, then two superimposed ripples with different time periodicity will appear in the frequency spectrum, and thus can easily be synthesized. The ripple pattern becomes very complicated when more than two echoes are present in the frequency spectrum. However, the individual multipath echoes can still be decomposed from the main signal using, for example, the DFT algorithm.

The calculated time-delays of the dominant echoes in the channel identify the critical taps in the adaptive equalizer, where the sliding window can be inserted until LMS error convergence is achieved. The well-known DFT algorithm can continuously provide information about the existing (already known) or "new" critical taps when the channel conditions are changing.

Figure 6:
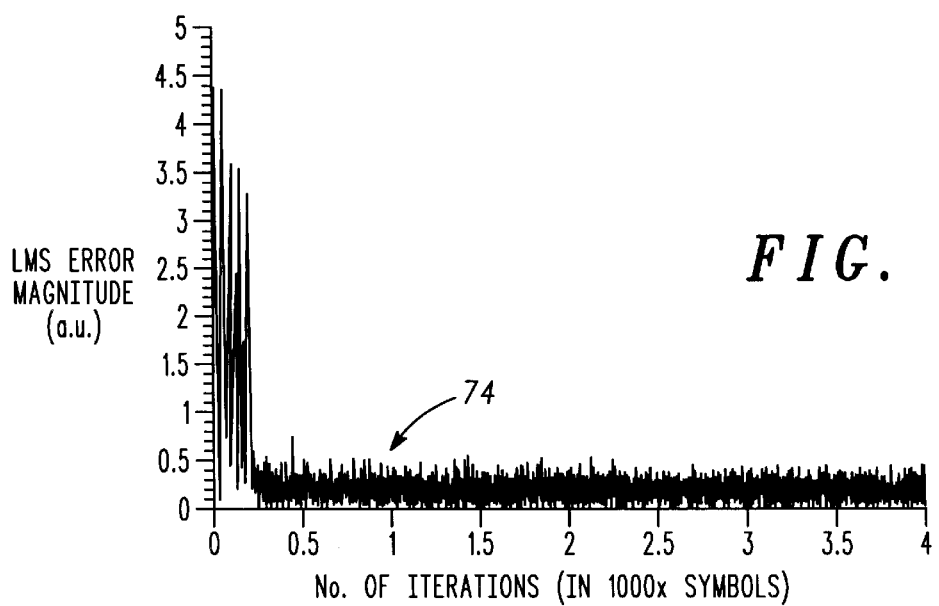
FIG. 6 is a graph providing an example of the LMS error magnitude versus the number of iterations for a 256-QAM signal, assuming the critical taps have been identified.

FIG. 6 illustrates an example of the LMS error magnitude 74 obtained using an adaptive equalizer in accordance with the invention for a 256-QAM signal in the presence of −5-dBc echo relative to the main signal. Notice that error convergence is achieved within only 300 iterations (assuming the critical taps have been identified) compared with substantially more iterations required by the prior art structures (e.g., 31,250 iterations noted in U.S. Pat. No. 5,243,624 to Paik et al.). This fast convergence is at least 100 times faster than the conventional methods mentioned above.

Figure 7:
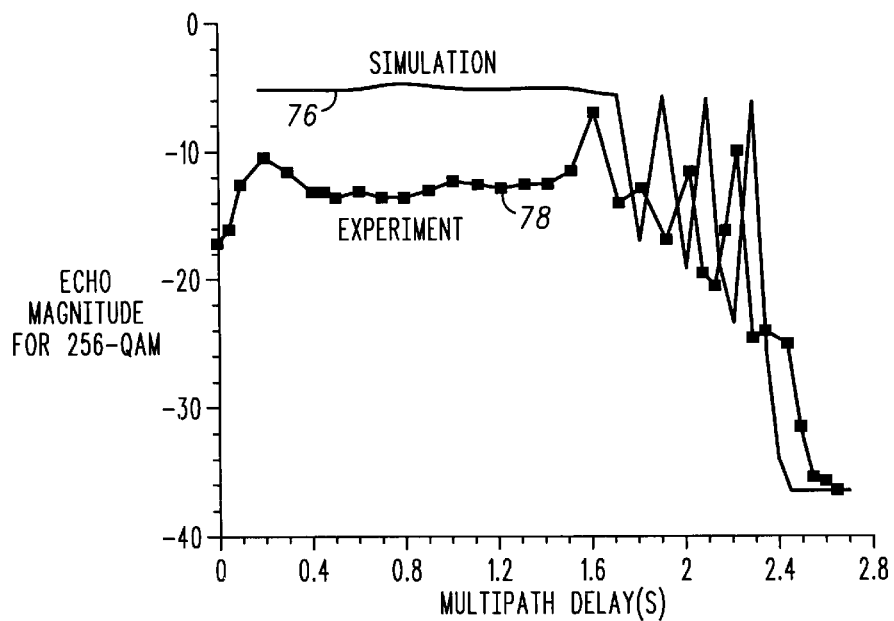
FIG. 7 is a graph providing an example of a simulated echo magnitude that can be equalized based on the proposed decision feedback equalizer (DFE) method and measured echo magnitude (conventional DFE) relative to the main 256-QAM signal with SNR equal to 30-dB versus the echo delay time in microseconds.

FIG. 7 illustrates a simulated echo magnitude 76 (solid line) that can be equalized by the adaptive equalizer in accordance with the invention relative to the main 256-QAM signal with a given signal-to-noise-ratio (SNR) versus the echo time-delay (microseconds). The measured results 78 (squares) is based on the conventional LMS algorithm. This result demonstrates about 9-dB improvement in the echo magnitude that can be reliably equalized using the proposed method. The effect is expected to be even larger in the presence of multiple echoes.

Figure 8:
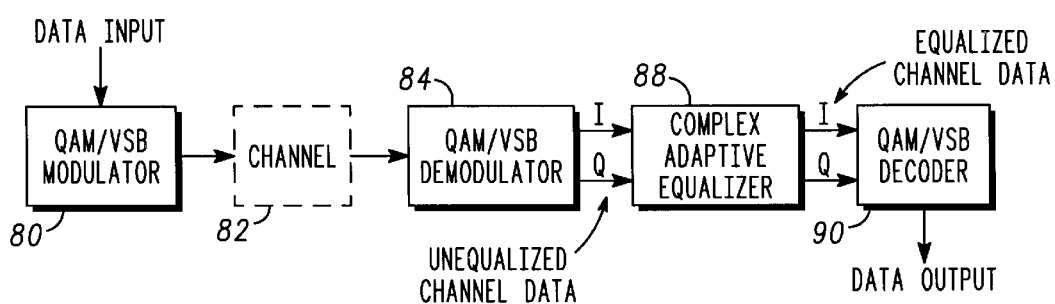
FIG. 8 is a simplified block diagram of the transmission system model, including the QAM/VSB modulator and transmitter, QAM/VSB demodulator, the complex adaptive equalizer, the QAM/VSB decoder, and the transmission channel.

FIG. 8 shows a simplified block diagram of the transmission system apparatus. It consists of a digital modulator 80, such as a QAM or VSB modulator. For purposes of simplicity, the "modulator" 80 in FIG. 8 is assumed to include a digital transmitter, although the transmitter is often considered to be a separate component that receives the modulated data from the modulator for transmission-over a communication channel. The input signal ("data input") to modulator 80 contains digital data. Once this digital data is modulated, e.g., using QPM or VSB modulation, it is communicated by the transmitter over a communication channel 82 to a digital receiver. The digital receiver consists of a demodulator 84 (which may, for example, comprise a QAM or VSB demodulator), a complex adaptive equalizer 88, and a decoder 90 (which may comprise, for example, a QAM or VSB decoder). The data received from the communication channel 82 is first demodulated in demodulator 84, but is unequalized. The unequalized channel data comprises in-phase (I) and quadrature (Q) components as well known in the art. The equalizer 88 equalizes the demodulated data for subsequent decoding by decoder 90. The equalized channel data output from the equalizer comprises equalized I and Q components which, in turn, are input to the decoder 90. The decoded, demodulated data is then output from decoder 90 for additional processing by a microcomputer, micro-controller, or the like.

It should now be appreciated that the present invention provides a multiphase and/or multiple amplitude receiver, such as a 64/256 quadrature amplitude modulation (QAM) or VSB receiver, with improved performance in the presence of single and multiple echoes. A moving window adaptive decision feedback equalizer (DFE) is provided according to the adaptive equation (2):

$$C_n(k+1) = C_n(k) - \Delta \cdot W(k) \cdot E_n(k) \cdot X_n(k) \qquad \text{Eq.(2)}$$

where Δ (delta) is the step size, $C_n(k)$ is the tap value of tap n for the k symbol, $E_n(k)$ is the error output at the symbol k, $X_n(k)$ is the received signal for pre-cursor taps (FFE) and past decision output for post-cursor taps (DFE), and W(k) is the sliding window function of time k. In the adaptation process, some coefficients are fixed while other coefficients are being adapted by adjusting associated taps. In particular, the adaptation is focused on a group of complex coefficients, which correspond to received echoes. By only adjusting the taps associated with this group of complex coefficients, no interference or noise is introduced to the decision-making device in the digital receiver and therefore, the effect of noise and multipath echoes on the adaptation control is substantially reduced. While the method and apparatus of the invention are useful for virtually any digital communication application, they are particularly well suited to digital television applications, such as high definition television.

Although the invention has been described herein in connection with various specific embodiments, it should be appreciated that numerous adaptations and modifications may be made thereto without departing from the scope of the invention as set forth in the claims.

What is claimed is:

1. A method for updating coefficients in an adaptive equalizer having at least one equalizer filter stage with taps that receive said coefficients during successive filter clock cycles, comprising the steps of:

identifying a set of said taps that correspond to a plurality of received echoes; and selectively adjusting the taps in said set according to a current error output from said equalizer;

whereby coefficients that do not correspond to received echoes remain fixed while coefficients that do correspond to received echoes are adjusted using a moving window algorithm.

2. A method in accordance with claim 1 wherein said identifying step uses a trial-and-error method to identify the taps corresponding to received echoes.

3. A method in accordance with claim 1 wherein said identifying step uses a sweeping method to identify the taps corresponding to received echoes.

4. A method in accordance with claim 1 wherein said identifying step uses an off-line processing method to identify the taps corresponding to received echoes.

5. A method in accordance with claim 1 wherein said moving window algorithm enables different taps to be adjusted at different times.

6. An adaptive equalizer comprising:

at least one equalizer filter stage with taps that receive coefficients to be updated during successive filter clock cycles; and means for selectively adjusting different ones of said taps in response to a plurality of received echoes;

wherein taps corresponding to said received echoes are adjusted using a moving window algorithm, and coefficients that do not correspond to said received echoes remain fixed.

7. An adaptive equalizer in accordance with claim 6 wherein said moving window algorithm enables different taps to be adjusted at different times.

8. An adaptive equalizer for a digital communications receiver comprising:

at least one equalizer filter stage with taps that receive coefficients to be updated during successive filter clock cycles;

a processor adapted to run an algorithm to locate taps that correspond to echoes received by said digital communications receiver;

said taps being selectively responsive to said processor;

wherein those taps that correspond to a plurality of received echoes are adjusted to update the coefficients associated therewith using a moving window algorithm.

9. An adaptive equalizer in accordance with claim 8 wherein said algorithm comprises a trial-and-error routine to identify the taps corresponding to received echoes.

10. An adaptive equalizer in accordance with claim 8 wherein said algorithm comprises a sweeping routine to identify the taps corresponding to received echoes.

11. An adaptive equalizer in accordance with claim 8 wherein said algorithm comprises an off-line processing routine to identify the taps corresponding to received echoes.

12. An adaptive equalizer in accordance with claim 8 wherein said moving window algorithm enables different taps to be adjusted at different times.

13. An adaptive equalizer in accordance with claim 8 wherein said moving window algorithm enables different taps to be adjusted at the same time.

14. An adaptive equalizer in accordance with claim 8 wherein said taps are adjusted using a switch.

15. An adaptive equalizer in accordance with claim 8 wherein said taps are adjusted using a variable attenuator.

16. An adaptive equalizer in accordance with claim 8 wherein said digital communications receiver is a QAM receiver.

17. An adaptive equalizer in accordance with claim 8 wherein said digital communications receiver is a QPSK receiver.

18. An adaptive equalizer in accordance with claim 8 wherein said digital communications receiver is a vestigial sideband (VSB) receiver.

19. A method in accordance with claim 1 wherein said moving window algorithm enables different taps to be adjusted at the same time.

20. A method in accordance with claim 19 wherein said taps are adjusted based on the formula:

$$C_n(k+1) = C_n(k) - \Delta \cdot W(k) E_n(k) X_n(k);$$

where $\Delta$ (delta) is the step size, $C_n(k)$ is the tap value of tap n for the k symbol, $E_n(k)$ is the error output at the symbol k, $X_n(k)$ is the received signal for pre-cursor taps (FFE) and past decision output for post-cursor taps (DFE), and $W(k)$ is the moving window function.

21. A method in accordance with claim 6 wherein said moving window algorithm enables different taps to be adjusted at the same time.

22. A method in accordance with claim 21 wherein said taps are adjusted based on the formula:

$$C_n(k+1) = C_n(k) - \Delta W(k) E_n(k) X_n(k);$$

where $\Delta$ (delta) is the step size, $C_n(k)$ is the tap value of tap n for the k symbol, $E_n(k)$ is the error output at the symbol k, $X_n(k)$ is the received signal for pre-cursor taps (FFE) and past decision output for post-cursor taps (DFE), and $W(k)$ is the moving window function.

23. A method in accordance with claim 13 wherein said taps are adjusted based on the formula:

$$C_n(k+1) = C_n(k) - \Delta \cdot W(k) E_n(k) X_n(k);$$

where $\Delta$ (delta) is the step size, $C_n(k)$ is the tap value of tap n for the k symbol, $E_n(k)$ is the error output at the symbol k, $X_n(k)$ is the received signal for pre-cursor taps (FFE) and past decision output for post-cursor taps (DFE), and $W(k)$ is the moving window function.

* * * * *

UNITED STATES PATENT AND TRADEMARK OFFICE
CERTIFICATE OF CORRECTION

PATENT NO.    : 6,563,868 B1
DATED         : May 13, 2003
INVENTOR(S)   : Zhang et al.

It is certified that error appears in the above-identified patent and that said Letters Patent is hereby corrected as shown below:

<u>Title page,</u>
Item [73], Assignee, delete the "s" at the end of "Instruments" so that the Assignee name reads:

-- [73] Assignee: General Instrument Corporation --

Signed and Sealed this

Ninth Day of September, 2003

JAMES E. ROGAN
*Director of the United States Patent and Trademark Office*